United States Patent
Fang

(10) Patent No.: US 12,550,654 B2
(45) Date of Patent: Feb. 10, 2026

(54) METHOD FOR MANUFACTURING SEMICONDUCTOR PACKAGE

(71) Applicant: Advanced Semiconductor Engineering, Inc., Kaohsiung (TW)

(72) Inventor: Hsu-Nan Fang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 853 days.

(21) Appl. No.: 17/000,232

(22) Filed: Aug. 21, 2020

(65) Prior Publication Data

US 2022/0059406 A1    Feb. 24, 2022

(51) Int. Cl.
| | |
|---|---|
| H01L 21/78 | (2006.01) |
| H01L 21/50 | (2006.01) |
| H01L 21/66 | (2006.01) |
| H01L 23/00 | (2006.01) |

(52) U.S. Cl.
CPC .............. *H01L 21/78* (2013.01); *H01L 21/50* (2013.01); *H01L 22/30* (2013.01); *H01L 24/71* (2013.01)

(58) Field of Classification Search
CPC .............. H01L 2224/7565; H01L 2224/75654
See application file for complete search history.

(56) References Cited

U.S. PATENT DOCUMENTS

| | | | | |
|---|---|---|---|---|
| 4,859,269 A | * | 8/1989 | Nishiguchi | H05K 13/0417 156/765 |
| 6,364,089 B1 | * | 4/2002 | Singh | H01L 21/67132 198/408 |
| 9,929,121 B2 | | 3/2018 | Colosimo et al. | |
| 2004/0020043 A1 | * | 2/2004 | Ueno | H05K 13/0812 29/832 |
| 2004/0154161 A1 | * | 8/2004 | Aoyama | B65G 29/00 29/709 |
| 2006/0238345 A1 | * | 10/2006 | Ferguson | G06K 7/0095 340/572.1 |
| 2007/0020801 A1 | * | 1/2007 | Ishikawa | G06K 19/07745 438/106 |
| 2007/0114659 A1 | * | 5/2007 | Cote | H01L 24/95 257/723 |
| 2009/0158564 A1 | * | 6/2009 | Aoyama | G06K 19/07749 29/25.01 |

(Continued)

OTHER PUBLICATIONS

U.S. Appl. No. 16/849,904, filed Apr. 15, 2020, Chang et al.
Bondtech.Co.,Ltd., Surface activated Bonding COW (for Semiconductor front end), Catalog, 2018, 1 page.

*Primary Examiner* — Erik T. K. Peterson
(74) *Attorney, Agent, or Firm* — FOLEY & LARDNER LLP

(57) ABSTRACT

The present disclosure provides a method for manufacturing a semiconductor package. The method includes disposing a first semiconductor substrate on a temporary carrier and dicing the first semiconductor substrate to form a plurality of dies. Each of the plurality of dies has an active surface and a backside surface opposite to the active surface. The backside surface is in contact with the temporary carrier and the active surface faces downward. The method also includes transferring one of the plurality of dies from the temporary carrier to a temporary holder. The temporary holder only contacts a periphery portion of the active surface of the one of the plurality of dies.

16 Claims, 14 Drawing Sheets

(56) References Cited

U.S. PATENT DOCUMENTS

| | | | | |
|---|---|---|---|---|
| 2009/0269178 A1* | 10/2009 | Trinks | H01L 21/67144 | 414/800 |
| 2011/0224073 A1* | 9/2011 | Owashi | G06K 19/07718 | 156/64 |
| 2011/0289772 A1* | 12/2011 | Kosaka | H01L 24/97 | 29/832 |
| 2012/0168089 A1* | 7/2012 | Schmidt-Lange | H01L 21/68 | 156/538 |
| 2013/0025791 A1* | 1/2013 | Marte | H01L 21/67253 | 156/538 |
| 2014/0259633 A1* | 9/2014 | Okandan | H05K 3/303 | 29/739 |
| 2015/0048523 A1* | 2/2015 | Suga | B23K 37/0408 | 228/104 |
| 2016/0126218 A1* | 5/2016 | Kurita | H01L 24/75 | 156/349 |
| 2017/0062257 A1* | 3/2017 | Speer | H01L 21/67144 | |
| 2018/0303015 A1* | 10/2018 | Koch | H01L 21/67132 | |
| 2018/0308727 A1* | 10/2018 | Junker | H01L 24/75 | |
| 2019/0067243 A1* | 2/2019 | Davies | H01L 24/97 | |
| 2019/0300289 A1* | 10/2019 | Cok | H01L 21/67121 | |
| 2020/0006099 A1* | 1/2020 | Yamauchi | H01L 24/81 | |
| 2020/0144218 A1* | 5/2020 | Wang | H01L 21/67144 | |
| 2020/0152491 A1* | 5/2020 | Koch | H05K 13/0409 | |
| 2020/0176287 A1* | 6/2020 | Davies | H01L 25/50 | |
| 2020/0266086 A1* | 8/2020 | Augst | H05K 13/081 | |
| 2020/0321307 A1* | 10/2020 | Uzoh | H01L 25/0652 | |
| 2021/0265300 A1* | 8/2021 | Yamauchi | H01L 24/80 | |
| 2021/0313211 A1* | 10/2021 | Yamauchi | H01L 21/67259 | |

* cited by examiner

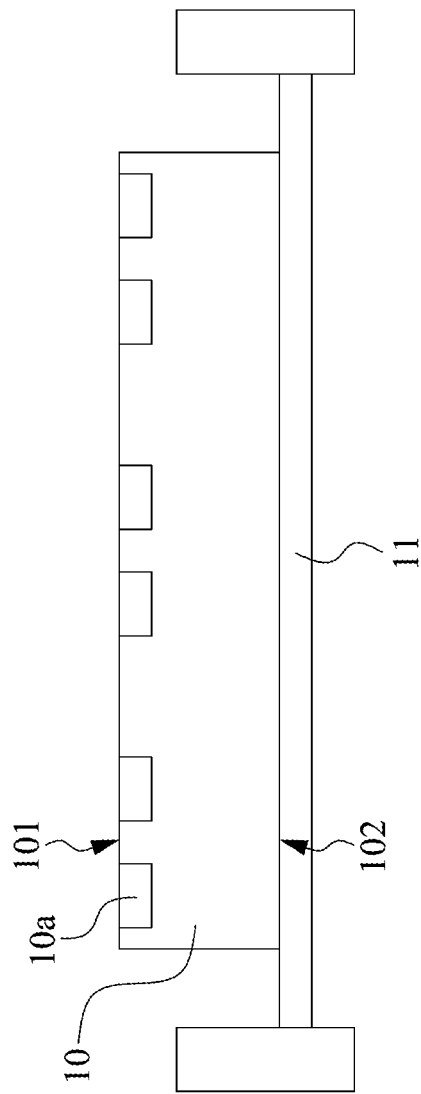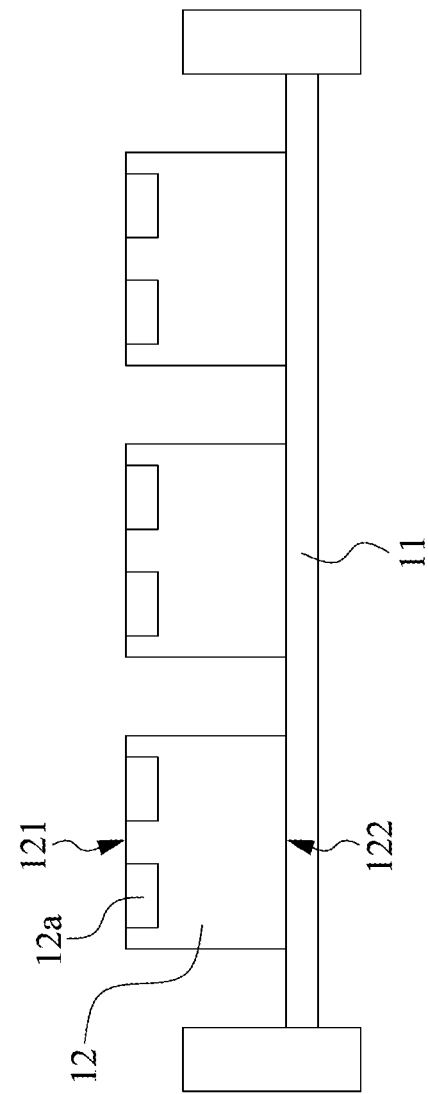

METHOD FOR MANUFACTURING SEMICONDUCTOR PACKAGE

BACKGROUND

1. Technical Field

The present disclosure generally relates to a method for manufacturing semiconductor package.

2. Description of the Related Art

In existing semiconductor structures, hybrid bonding is commonly used as interconnections. To obtain a satisfying result for hybrid bonding, an extreme flat surface of dielectric (e.g., silicon oxides) surrounding the copper bump should be obtained prior to the dielectric-dielectric bonding stage. The extremely flat surface (e.g., surface roughness Ra smaller than 0.5 nm) of the dielectric is required so that the Van-der-Waal force can be established, followed by a low temperature annealing operation to covalent bond the dielectric interface. Subsequently, a higher temperature annealing operation is performed to cause interdiffusion between copper-copper interface. Such extremely flat surface of the dielectric should be formed in a well-controlled environment, such as an ISO class 1 cleanroom, to prevent particle contamination which could unduly deteriorate the extremely flat surface condition. The cost for ISO class 1 cleanroom facility is considerably high, hindering the wide adoption of hybrid bonding technique in assembly house.

In addition, alignment accuracy in hybrid bonding also plays an important role especially when the pitch of the copper bumps at the hybrid bonding interface is ever decreasing (e.g., smaller than 3 μm or 1 μm). The tolerance for alignment can be as small as 0.3 μm. Conventional alignment approaches are usually too time-consuming to achieve an acceptable production through put.

SUMMARY

In one or more embodiments, the present disclosure provides a method for manufacturing a semiconductor package. The method includes disposing a first semiconductor substrate on a temporary carrier and dicing the first semiconductor substrate to form a plurality of dies. Each of the plurality of dies has an active surface and a backside surface opposite to the active surface. The backside surface is in contact with the temporary carrier and the active surface faces downward. The method also includes transferring one of the plurality of dies from the temporary carrier to a temporary holder. The temporary holder only contacts a periphery portion of the active surface of the one of the plurality of dies.

In one or more embodiments, the present disclosure provides a method for manufacturing a semiconductor package. The method includes providing a semiconductor die having an active surface and a backside surface opposite to the active surface. An electrical contact is disposed on the active surface of the semiconductor die. The method also includes carrying the semiconductor die from the backside surface through a bonding device and obtaining a relative position information of the bonding device and the electrical contact of the semiconductor die.

In one or more embodiments, the present disclosure provides a method for manufacturing a semiconductor package. The method includes providing a plurality of semiconductor dies on a temporary carrier and transferring at least one of the semiconductor dies to a substrate. A backside surface of the at least one of the semiconductor dies faces an active surface of the substrate during the transferring. The method also includes flipping the at least one of the semiconductor dies so that an active surface of the at least one of the semiconductor dies facing toward the active surface of the substrate. The method also includes bonding the active surface of the at least one of the semiconductor dies to the active surface of the substrate.

BRIEF DESCRIPTION OF THE DRAWINGS

Aspects of the present disclosure are readily understood from the following detailed description when read with the accompanying figures. It should be noted that various features may not be drawn to scale. The dimensions of the various features may be arbitrarily increased or reduced for clarity of discussion.

FIG. 1 illustrates a cross sectional view during one or more stages of a method of manufacturing a semiconductor package in accordance with some embodiments of the present disclosure.

FIG. 2 illustrates a cross sectional view during one or more stages of a method of manufacturing a semiconductor package in accordance with some embodiments of the present disclosure.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 3:
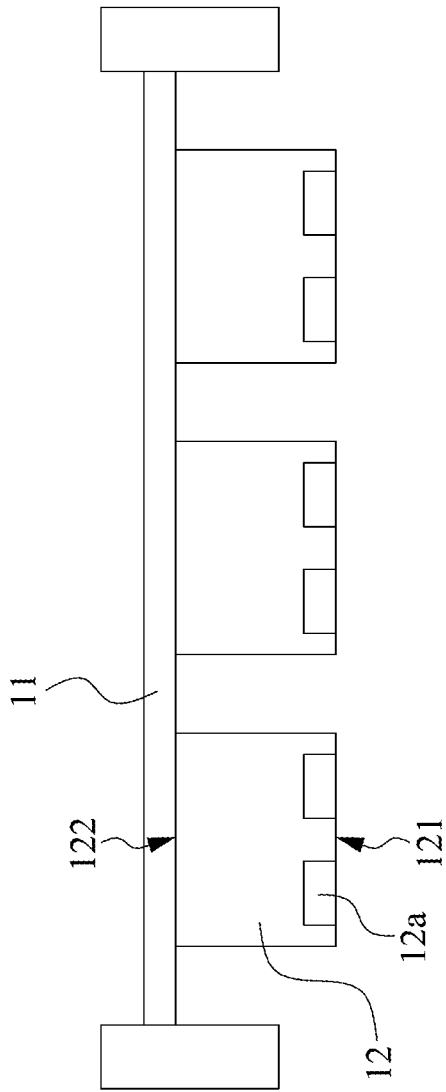
FIG. 3 illustrates a cross sectional view during one or more stages of a method of manufacturing a semiconductor package in accordance with some embodiments of the present disclosure.

The following disclosure provides for many different embodiments, or examples, for implementing different features of the provided subject matter. Specific examples of components and arrangements are described below. These are, of course, merely examples and are not intended to be limiting. In the present disclosure, a reference to the formation of a first feature over or on a second feature in the description that follows may include embodiments in which the first and second features are formed in direct contact, and may also include embodiments in which additional features may be formed between the first and second features, such that the first and second features may not be in direct contact. Besides, the present disclosure may repeat reference numerals and/or letters in the various examples. This repetition is for simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

Present disclosure provides a method for forming interconnections of a die to a wafer. An active surface of the die is kept facing downward to prevent particles, dusts or other contaminants from falling onto the active surface. For example, the active surface of the die is kept facing downward after dicing until the die is positioned under a wafer (and covered by the wafer). The method can obtain a high density fine-pitch connection (e.g., L/S width equal to or less than 3 μm/3 μm) while retaining extremely flat surface condition (e.g., surface roughness Ra smaller than 0.5 nm) for surface morphology sensitive procedures such as hybrid bonding operations without being manufactured in an ISO class 1 cleanroom facility. In addition, the method also provides an alignment technique to meet the high alignment accuracy requirement without sacrificing production throughput. In some embodiments, the units per hour (UPH) of the process using the method of the present disclosure may be greater than 1000, greater than 2000, or more.

FIG. 1, FIG. 2, FIG. 3, FIG. 4, FIG. 5A, FIG. 6A, FIG. 7, FIG. 8A, FIG. 9, FIG. 10A, and FIG. 11 are cross-sectional views of a semiconductor device package at various stages of fabrication, in accordance with some embodiments of the present disclosure. At least some of these figures have been simplified to better understand the aspects of the present disclosure. FIG. 5B, FIG. 6B, FIG. 8B, FIG. 8C, and FIG. 10B are top views of a semiconductor device package at various stages of fabrication, in accordance with some embodiments of the present disclosure. At least some of these figures have been simplified to better understand the aspects of the present disclosure.

Referring to FIG. 1, a substrate 10 is disposed on a carrier 11 such as a tape. The substrate 10 can be mounted directly on the carrier 11 hold by a frame.

In some embodiments, the substrate 10 may be, for example, a semiconductor substrate, such as a silicon substrate, a germanium substrate, a gallium nitride substrate, or another suitable semiconductor substrate. In some embodiments, the substrate 10 may be a semiconductor wafer, such as a silicon wafer or another suitable semiconductor wafer. In some embodiments, the substrate 10 may include a plurality of chips or dies separated by a scribe line or a non-active, inter-die wafer area.

As shown in FIG. 1, the substrate 10 includes a surface 101 and a surface 102 opposite to the surface 101. In some embodiments, the surface 101 is an active surface and the surface 102 is a passive surface or a backside surface.

In some embodiments, the surface 101 may include analog or digital circuits (implemented as active devices, or passive devices) formed within the substrate 10 and electrically interconnected according to the electrical design and function of the substrate 10. An electrical contact 10a may be in proximity to the surface 101, adjacent to the surface 101, partially embedded in the surface 101, and/or partially exposed from the surface 101.

In some embodiments, the carrier 11 (which can also be referred to as a temporary carrier throughout the present disclosure) may be or may include, for example, a dicing tape, a carrier tape, or another suitable carrier for carrying the substrate 10. In some embodiments, the dicing tape may have a thickness between about 150 micrometer (μm) and about 300 μm. In some embodiments, the carrier 11 may also include a frame. For example, a frame may be supported by a periphery portion of the tape. In some embodiments, the frame may surround the tape.

Referring to FIG. 2, the substrate 10 is singulated or diced into a plurality of individual dies 12. In some embodiments, the substrate 10 is singulated or diced through the scribe line using a saw blade or laser cutting tool.

Each die 12 includes a surface 121 and a surface 122 opposite to the surface 121. In some embodiments, the surface 121 is an active surface and the surface 122 is a passive surface or a backside surface.

In some embodiments, the surface 121 may include analog or digital circuits (implemented as active devices, or passive devices) formed within the die 12 and electrically interconnected according to the electrical design and function of the die 12. In some embodiments, the circuits may include an electrical contact 12a in proximity to the surface 121, adjacent to the surface 121, embedded in the surface 121, and/or partially exposed from the surface 121.

In some embodiments, the surface 122 (such as a passive surface or a backside surface) of the die 12 is disposed on the carrier 11. For example, the surface 122 of the die 12 may be in contact with the carrier 11. For example, the surface 122 of the die 12 may directly contact the carrier 11.

Figure 9:
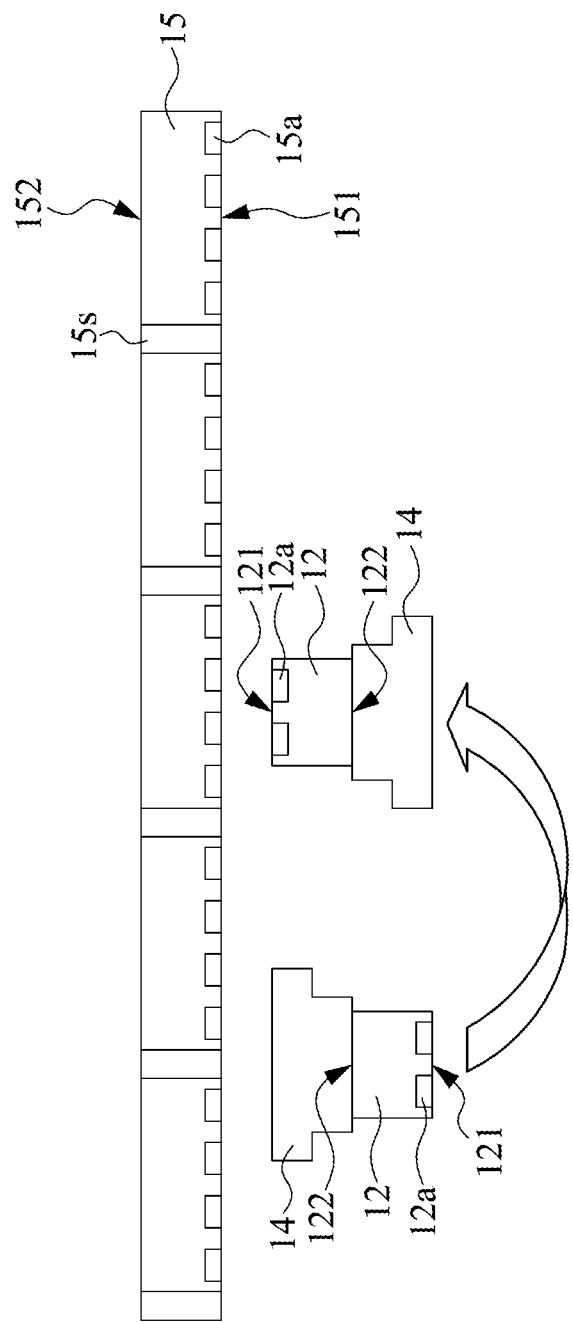
FIG. 9 illustrates a cross sectional view during one or more stages of a method of manufacturing a semiconductor package in accordance with some embodiments of the present disclosure.

Referring to FIG. 3, the carrier 11 and the die 12 are flipped such that the surface 121 (such as an active surface)

of the die 12 faces downward. In some embodiments, the surface 121 of the die 12 is kept facing downward from the operation of FIG. 3 until the die 12 is positioned under a substrate as illustrated in FIG. 9.

Figure 4:
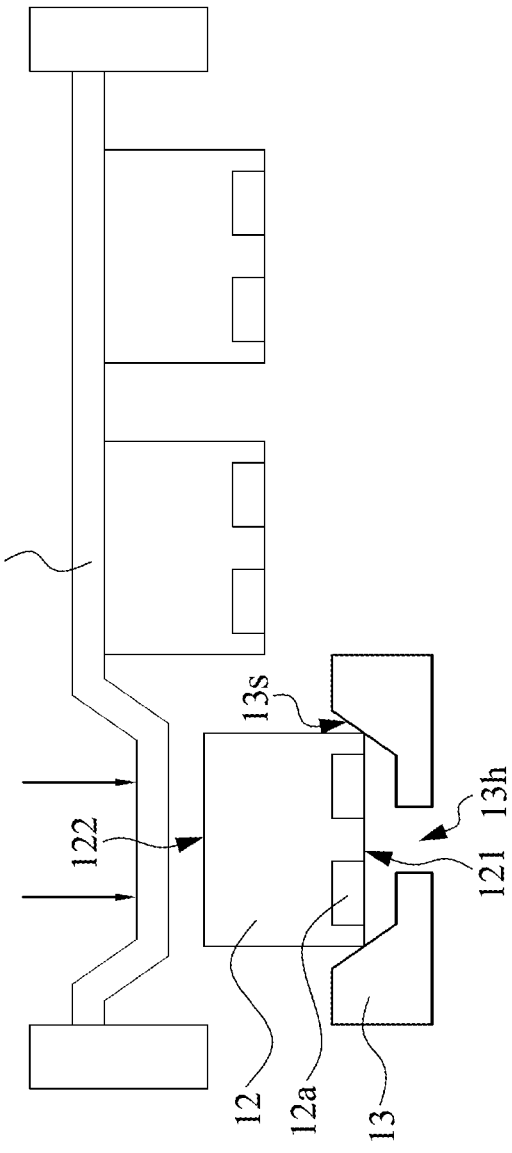
FIG. 4 illustrates a cross sectional view during one or more stages of a method of manufacturing a semiconductor package in accordance with some embodiments of the present disclosure.

Referring to FIG. 4, the die 12 is transferred from the carrier 11 to a holder 13 (which can also be referred to as a temporary holder throughout the present disclosure). In some embodiments, the holder 13 includes a tapered inner sidewall 13s. The tapered inner sidewall 13s of the holder 13 supports the die 12. A periphery portion of the surface 121 of the die 12 contacts the sidewall 13s of the holder 13. In some embodiments, the holder 13 only contacts the periphery portion of the surface 121 of the die 12. For example, the electrical contact 12a on the surface 121 of the die 12 is not in contact with the holder 13. For example, the electrical contact 12a on the surface 121 of the die 12 is spaced apart from the holder 13.

In some embodiments, a hardness of the holder 13 may be lesser than a hardness of the die 12 such that the die 12 would not be cracked or broken when being ejected from the carrier 11 to land on the holder 13.

In some embodiments, the holder 13 is positioned under the die 12 and the die 12 is removed from the carrier 11 and landed on to the holder 13. In some embodiments, the die 12 is removed from the carrier 11 by an ejection pinning operation or another suitable operation for removing the die 12 from the carrier 11.

In some embodiments, an air flow may be provided through an air hole 13h of the holder 13 to help transfer the die 12. For example, a vacuum suction or vacuum purge may be performed through the air hole 13h of the holder 13 under suitable conditions. For example, when the die 12 is thinner than a predetermined thickness, a vacuum suction may be applied through the air hole 13h to facilitate the proper landing of the die 12 to the holder 13. Alternatively, a vacuum purge can be applied through the air hole 13h when transferring the die 12 to a bonding device 14, as described in FIG. 5A, to prevent excessive pressure of the bonding device 14 exerted on the die 12.

Figure 5A:
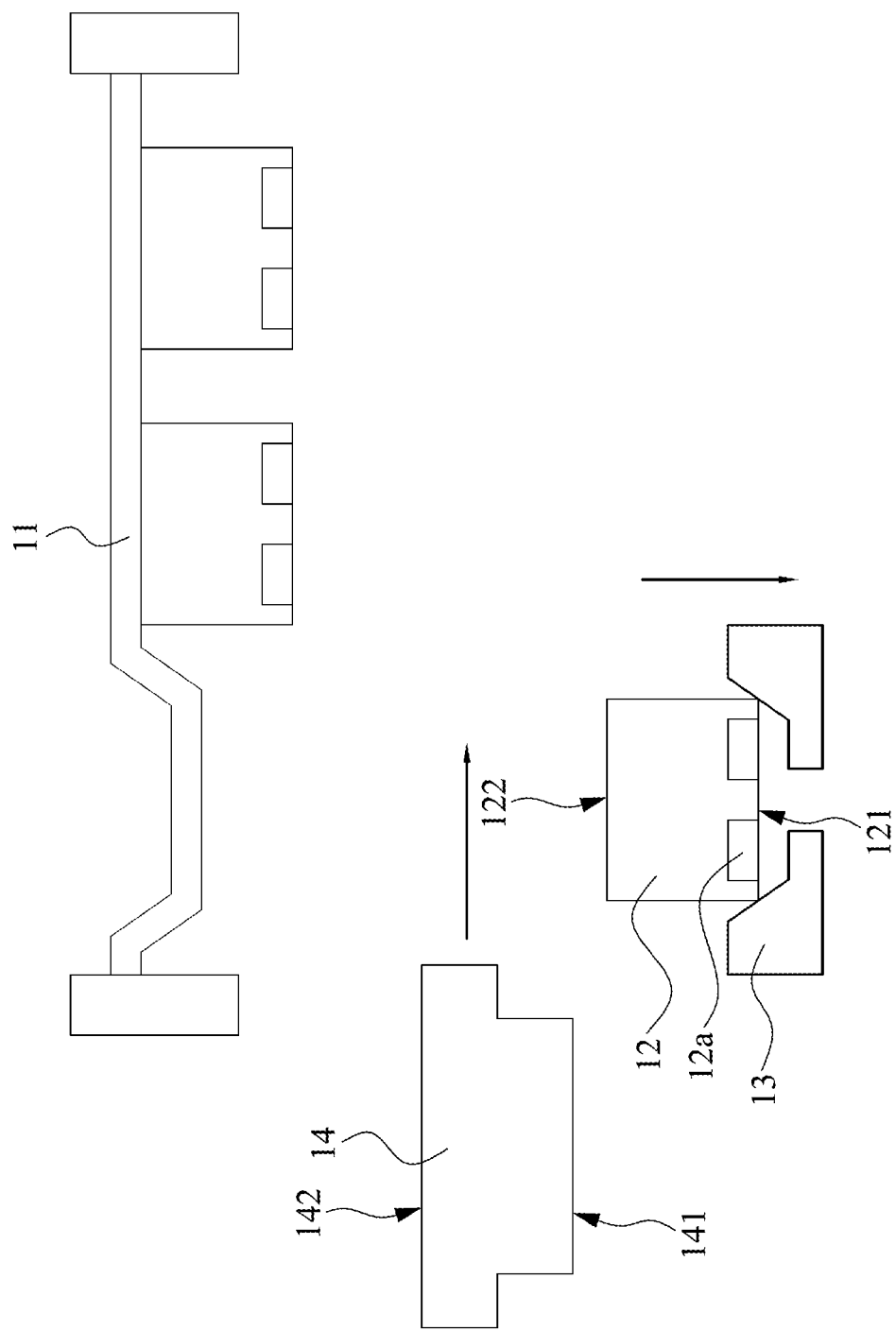
FIG. 5A illustrates a cross sectional view during one or more stages of a method of manufacturing a semiconductor package in accordance with some embodiments of the present disclosure.
Figure 6A:
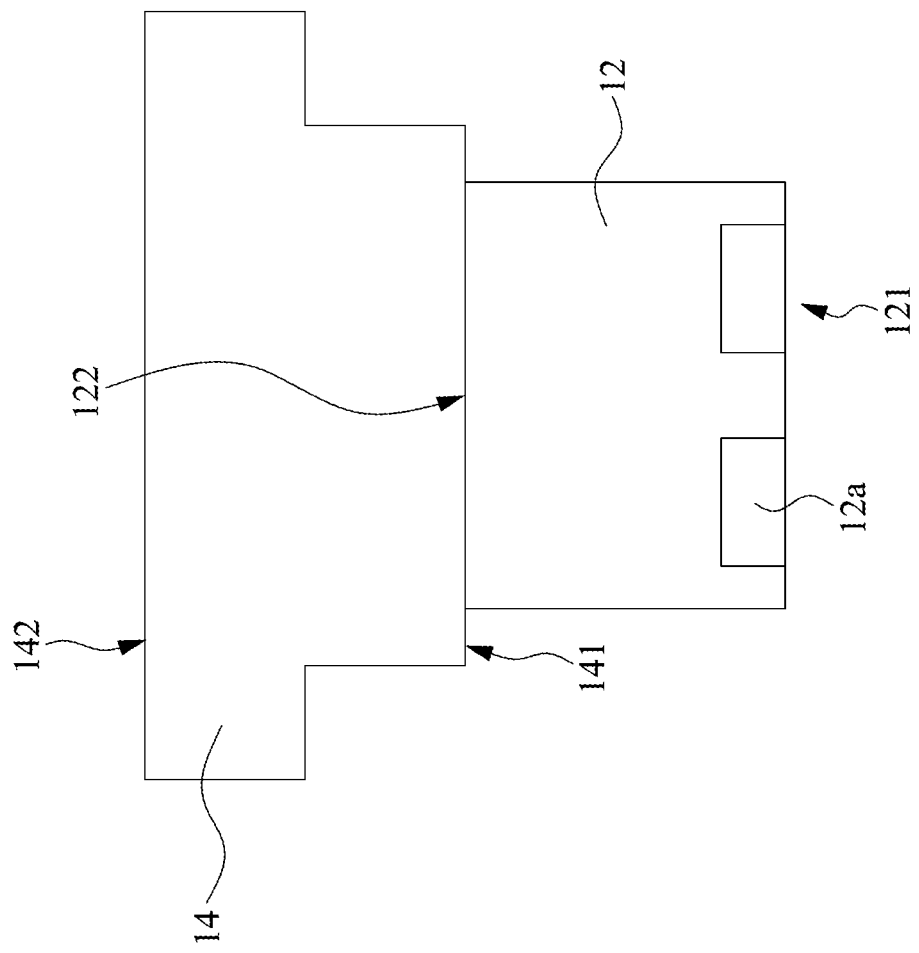
FIG. 6A illustrates a cross sectional view during one or more stages of a method of manufacturing a semiconductor package in accordance with some embodiments of the present disclosure.

Referring to FIG. 5A and FIG. 6A, the die 12 is transferred from the holder 13 to a bonding device 14. The bonding device 14 has a bottom surface 141 and a top surface 142.

In some embodiments, as shown by the arrows in FIG. 5A, the holder 13 may be moved down and away from the carrier 11. The bonding device 14 may be moved and located between the carrier 11 and the holder 13. In FIG. 6A, after the surface 122 of the die 12 is attached to the bonding device 14, the holder 13 may be removed from the die 12. The bottom surface 141 of the bonding device 14 contacts the surface 122 of the die 12. The surface 122 of the die 12 contacts the bonding device 14 and the surface 121 of the die 12 faces downward. In other words, the bonding device 14 carries the die 12 from the surface 122.

Figure 5B:
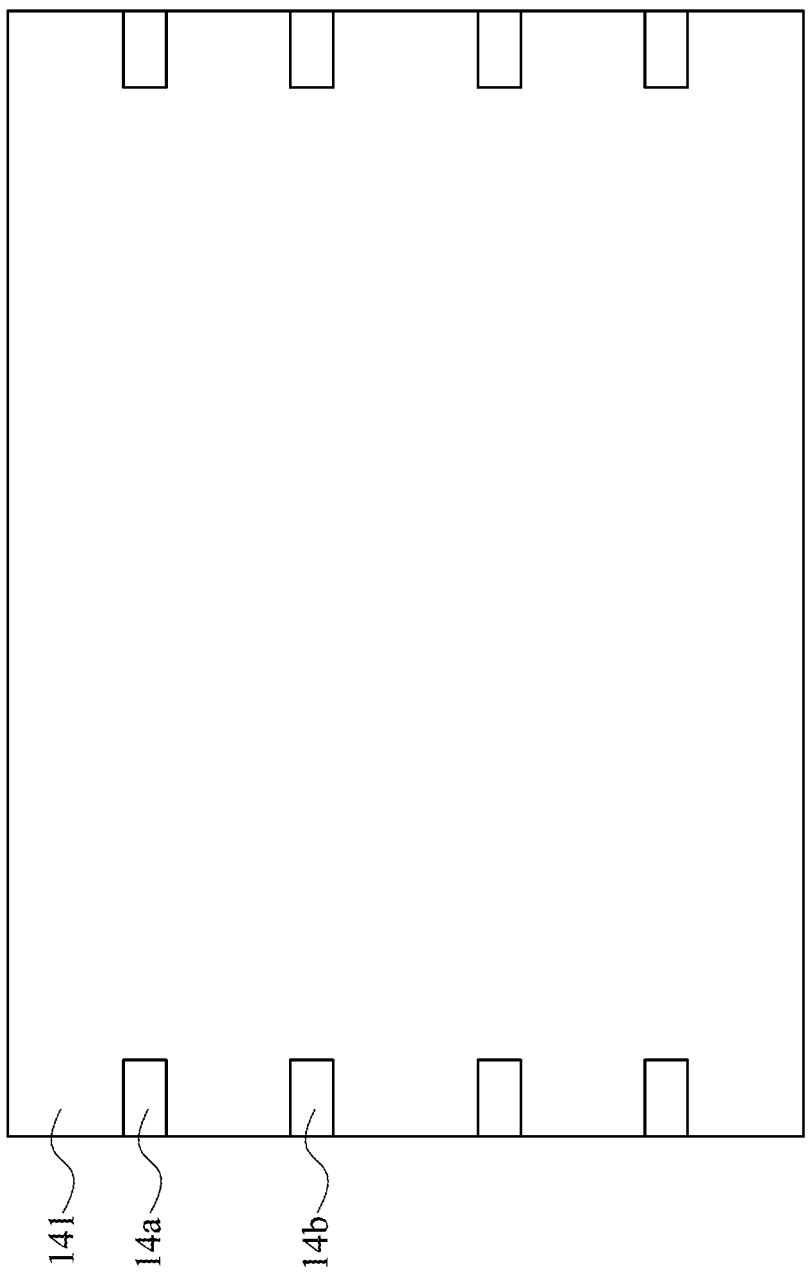
FIG. 5B illustrates a bottom view during one or more stages of a method of manufacturing a semiconductor package in accordance with some embodiments of the present disclosure.
Figure 6B:
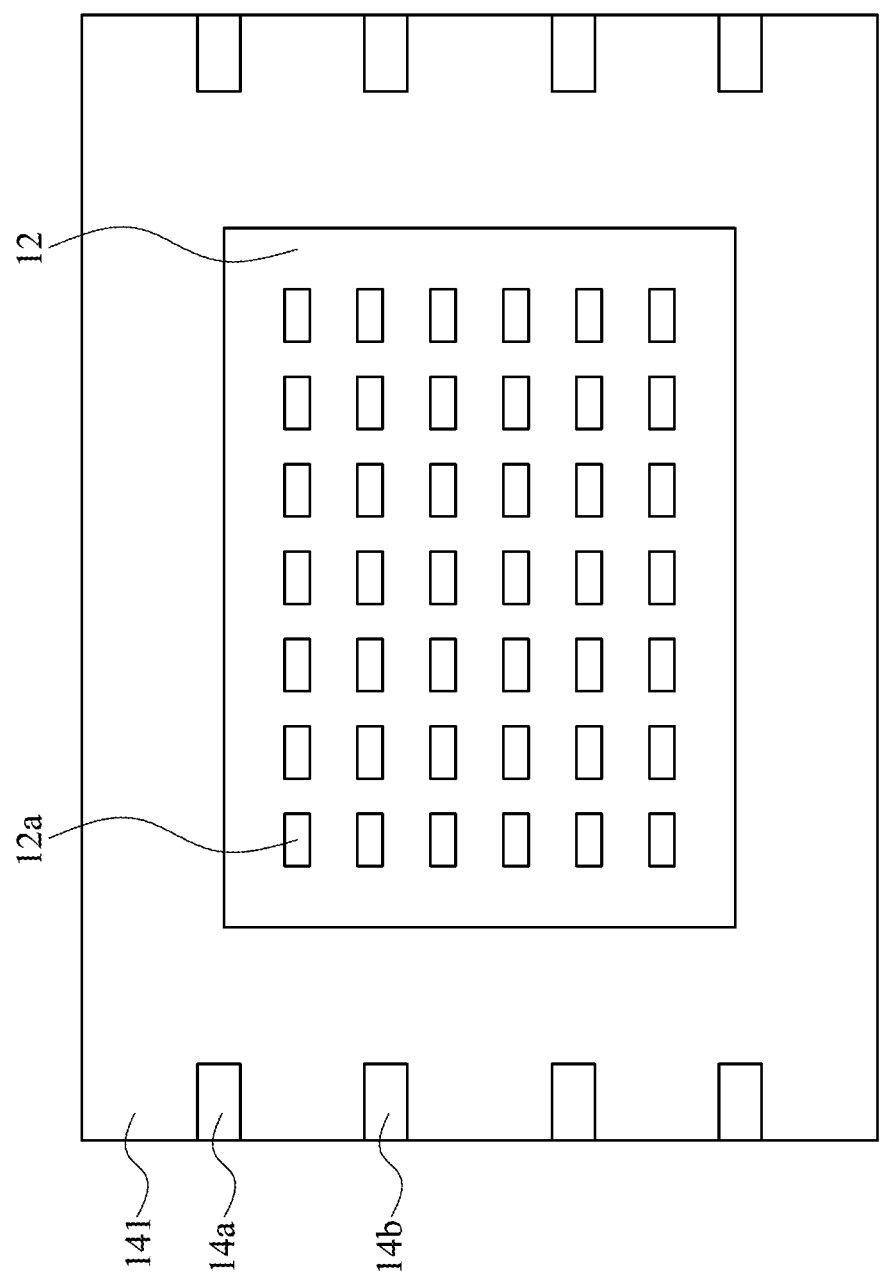
FIG. 6B illustrates a bottom view during one or more stages of a method of manufacturing a semiconductor package in accordance with some embodiments of the present disclosure.

Referring to FIG. 5B and FIG. 6B, FIG. 5B illustrates the bottom surface 141 of the bonding device 14 and FIG. 6B illustrates the bottom surface 141 of the bonding device 14 with the die 12 received or carried by the bonding device 14.

The bonding device 14 includes a central portion (not annotated in the figures) configured to receive or carry the die 12 and a periphery portion surrounding the central portion. For example, the die 12 may be received or carried on the central portion and spaced apart from the periphery portion. For example, the periphery portion is free from overlapping the die 12.

A plurality of reference patterns (such as the reference patterns 14a and 14b) are disposed or positioned on the periphery portion of the bonding device 14. In some embodiments, the reference patterns may be positioned proximate to a side of the bonding device 14. In some embodiments, the reference patterns may be disposed on at least two opposite sides of the bonding device 14. For example, a reference pattern is disposed on one side of the bonding device 14 and another reference pattern is disposed on another opposite side of the bonding device 14. In some embodiments, the reference patterns may be free from overlapping the die 12. Although there are eight reference patterns on the bonding device 14, the number and the location of the reference patterns on the bonding device 14 may be designed depending on design specifications, and the present disclosure is not limited thereto.

Figure 7:
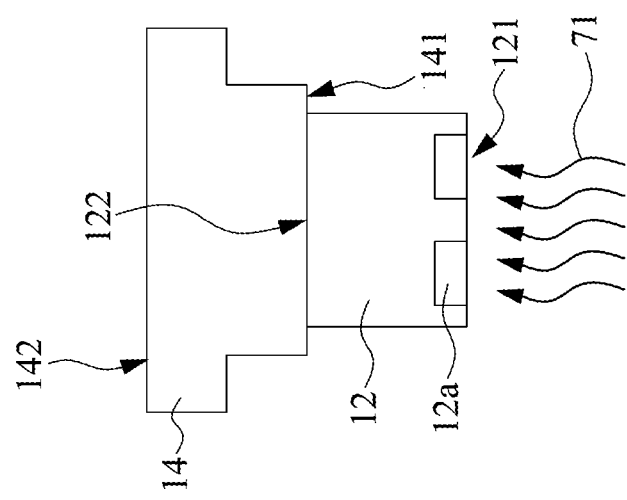
FIG. 7 illustrates a cross sectional view during one or more stages of a method of manufacturing a semiconductor package in accordance with some embodiments of the present disclosure.

Referring to FIG. 7, a surface treatment 71 may be performed to the surface 121 of the die 12 while the surface 121 of the die 12 faces downward. The surface treatment 71 may include, for example, a plasma treatment, a heat treatment, a moisture treatment, a wet cleaning treatment, a combination thereof, or another suitable treatment. In some embodiments, a plasma treatment (such as an oxygen plasma treatment) may be performed to the surface 121 of the die 12 to activate a silicon oxide surface for helping bonding with hydroxyl group. In some embodiments, a heat treatment (such as ultraviolet light irradiation) may be performed to the surface 121 of the die 12 to activate a copper surface for helping bonding with hydroxyl group. In some embodiments, a moisture treatment may be performed to the surface 121 of the die 12 to introduce hydroxyl group in the surface 121 of the die 12. In some embodiments, the aforesaid surface treatments to the surface 121 of the die 12 can be optional.

In some embodiments, other equipment or operations may be integrated with the method of the present disclosure. Since the method of the present disclosure may be performed under ISO class 100 or ISO class 1000 facility, integrating with other equipments or operations along the process flow allows more versatile operations to be performed over the die 12.

Figure 8A:
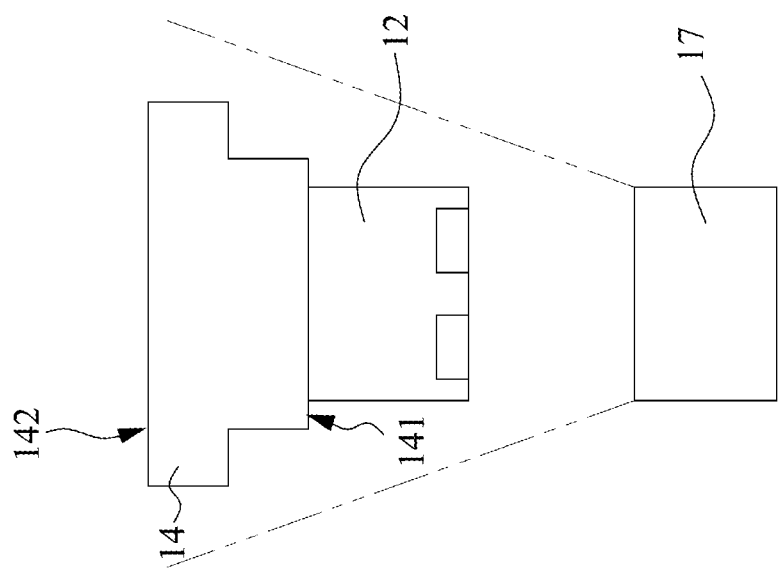
FIG. 8A illustrates a cross sectional view during one or more stages of a method of manufacturing a semiconductor package in accordance with some embodiments of the present disclosure.
Figure 8B:
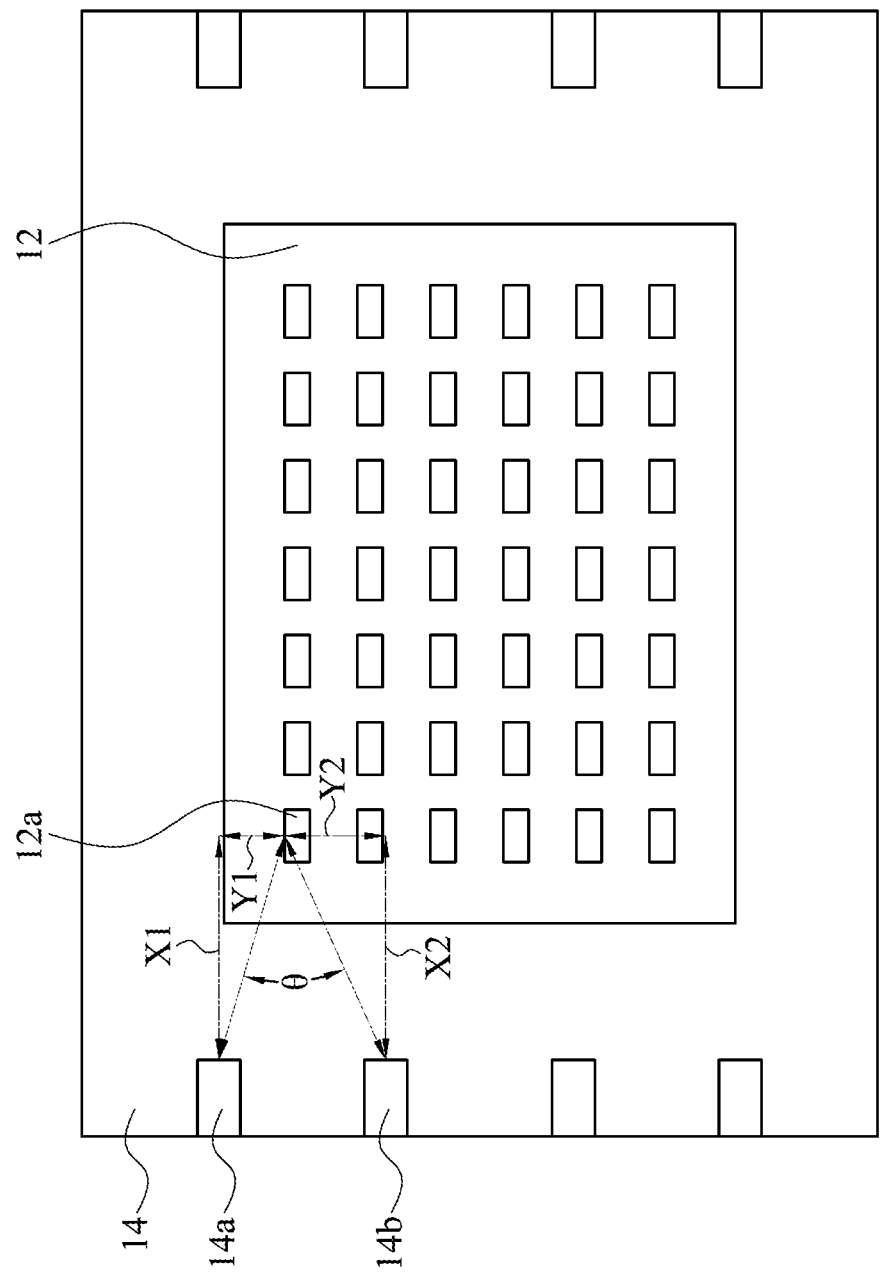
FIG. 8B illustrates a bottom view during one or more stages of a method of manufacturing a semiconductor package in accordance with some embodiments of the present disclosure.
Figure 8C:
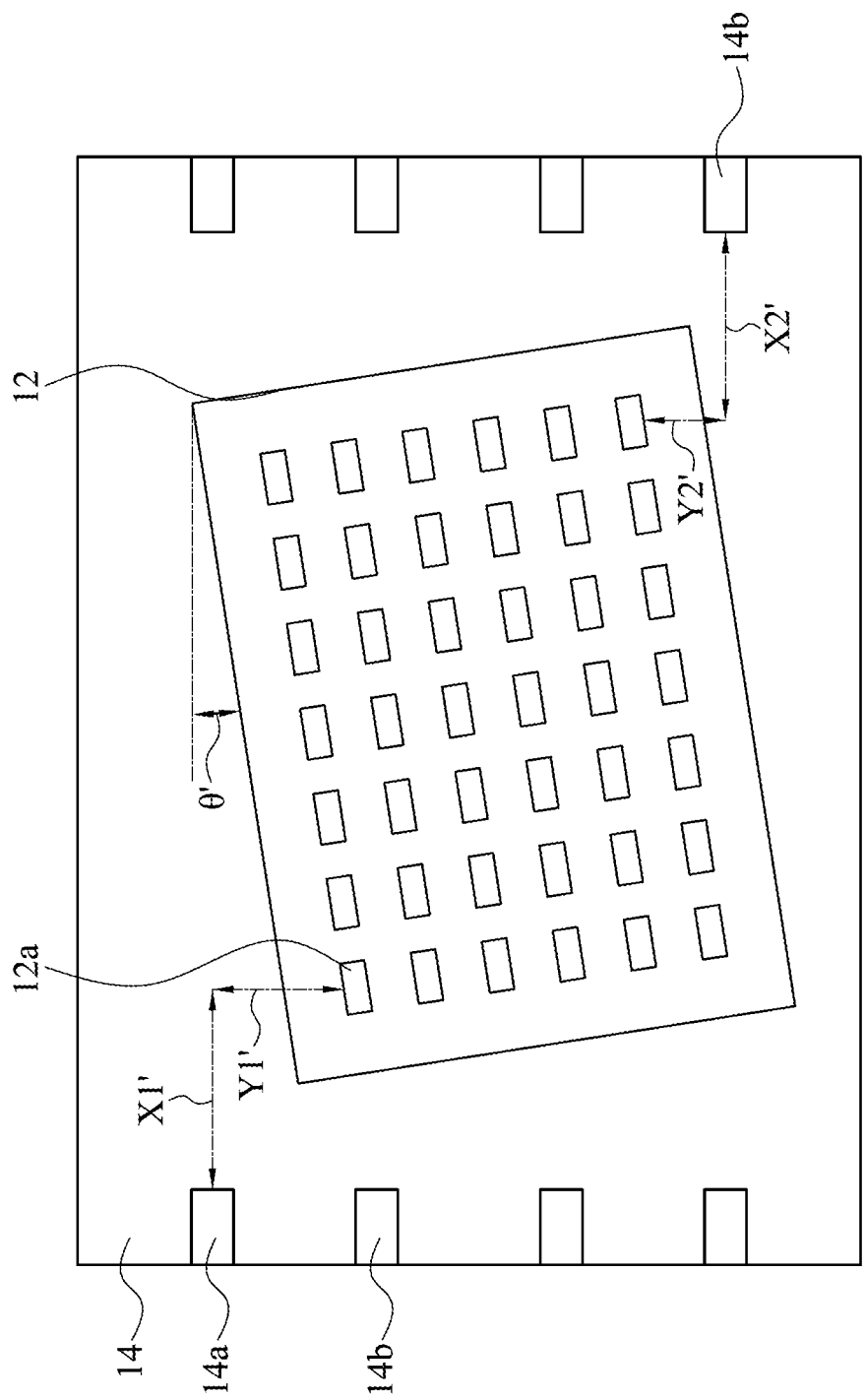
FIG. 8C illustrates a bottom view during one or more stages of a method of manufacturing a semiconductor package in accordance with some embodiments of the present disclosure.

Referring to FIG. 8A, a camera 17 captures an image of the surface 121 of the die 12 while the surface 121 of the die 12 faces downward. In some embodiments, relative position information of the bonding device 14 and the electrical contact 12a may be obtained from the image. For example, FIG. 8B and FIG. 8C illustrate images captured by the camera 17. In some embodiments, the image capturing operation is performed after the surface treatment illustrated in FIG. 7 and prior to the flipping of the die 12 as illustrated in FIG. 9.

Referring to FIG. 8B, the reference pattern 14a and the reference pattern 14b are disposed on the same side of the bonding device 14.

A distance $X_1$ in a first direction between the reference pattern 14a and the electrical contact 12a may be determined. A distance $Y_1$ in a second direction between the reference pattern 14a and the electrical contact 12a may be determined. In some embodiments, the second direction may be substantially perpendicular to the first direction.

Similarly, a distance $X_2$ in the first direction between the reference pattern 14b and the electrical contact 12a may be determined. A distance $Y_2$ in the second direction between the reference pattern 14b and the electrical contact 12a may be determined. A rotation angle (annotated as "θ" in FIG. 8B) of the die 12 may be determined based on the distance $X_1$, the distance $Y_1$, the distance $X_2$, and the distance $Y_2$.

Figure 10A:
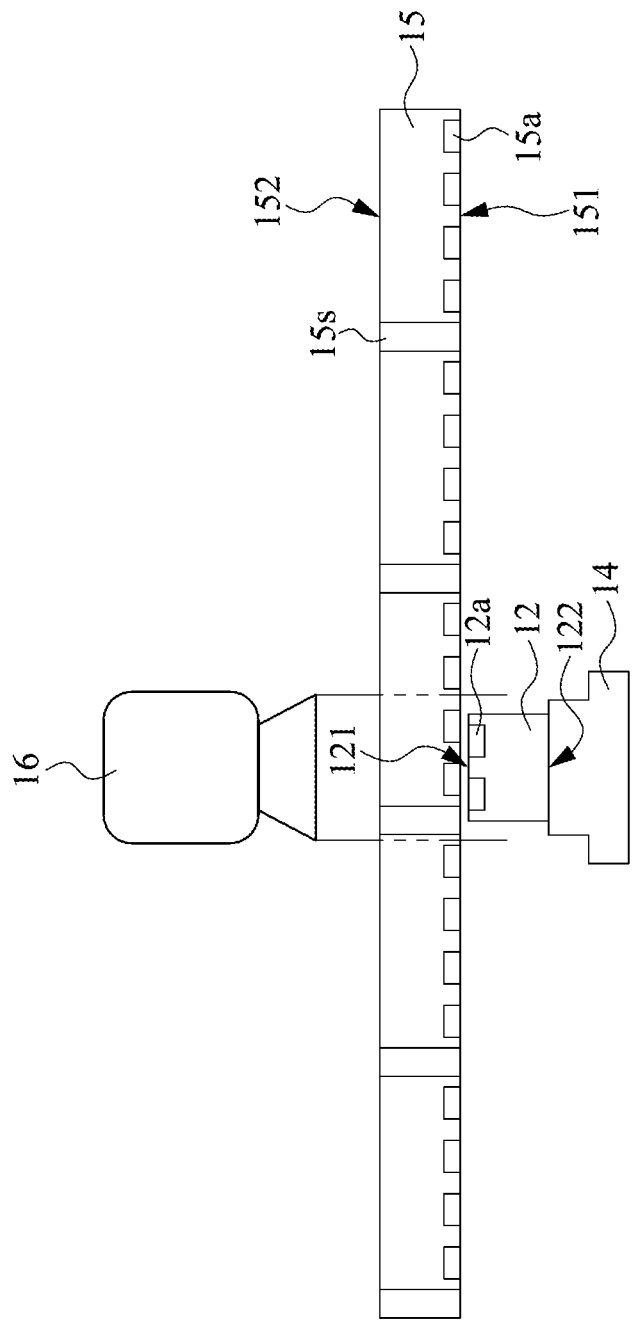
FIG. 10A illustrates a cross sectional view during one or more stages of a method of manufacturing a semiconductor package in accordance with some embodiments of the present disclosure.

In some embodiments, similar operations may be conducted to obtained relative position information between each of the reference patterns and each of the electrical contacts. In some embodiments, the relative position information may be used to align the die 12 and a substrate as illustrated in FIG. 10A.

Referring to FIG. 8C, the reference pattern 14a and the reference pattern 14b are disposed on opposite sides of the bonding device 14.

A distance $X_1'$ in the first direction between the reference pattern 14a and the electrical contact 12a may be determined. A distance $Y_1'$ in the second direction between the reference pattern 14a and the electrical contact 12a may be determined.

Similarly, a distance $X_2'$ in the first direction between the reference pattern 14b and the electrical contact 12a may be determined. A distance $Y_2'$ in the second direction between the reference pattern 14b and the electrical contact 12a may be determined. A rotation angle (annotated as "θ'" in FIG. 8C) of the die 12 may be determined based on the distance $X_1'$, the distance $Y_1'$, the distance $X_2'$, and the distance $Y_2'$.

In some embodiments, similar operations may be conducted to obtained relative position information between each of the reference patterns and each of the electrical contacts. The relative displacements of the electrical contact 12a (such as shift upward/downward, shift to left/right, shift to a corner, rotate in a clockwise/counter clockwise direction) with respect to the reference pattern 14a and the reference pattern 14b can be detected through the operations of FIGS. 8A-8C. In some embodiments, the relative position information may be used to align the die 12 and a substrate as illustrated in FIG. 10A.

Referring to FIG. 9, the die 12 is transferred to arrive under a substrate 15 while the surface 121 of the die 12 faces downward. In some embodiments, the substrate 15 overlaps or covers the die 12. After the die 12 arrives under the substrate 15, the bonding device 14 and the die 12 are flipped so that the surface 121 of the die 12 faces upward toward the substrate 15.

In some embodiments, the substrate 15 may be, for example, a semiconductor substrate, such as a silicon substrate, a germanium substrate, a gallium nitride substrate, or another suitable semiconductor substrate. In some embodiments, the substrate 15 may be a semiconductor wafer, such as a silicon wafer or another suitable semiconductor wafer.

The substrate 15 includes a surface 151 and a surface 152 opposite to the surface 151. In some embodiments, the surface 151 is an active surface (which can also be referred to as a bonding surface) and the surface 152 is a passive surface or a backside surface. The substrate 15 may include a plurality of chips or dies separated by a scribe line 15s. An electrical contact 15a (which can also be referred to as a conductive pad throughout the present disclosure) may be in proximity to the surface 151, adjacent to the surface 151, embedded in the surface 151, and/or partially exposed from the surface 151. The electrical contact 15a may be spaced apart from the scribe line 15s. The electrical contact 15a may be adjacent to the scribe line 15s.

Referring to FIG. 10A, the electrical contact 12a on the die 12 is aligned with the electrical contact 15a on the substrate 15. In some embodiments, the alignment may be conducted by, for example, a charged-coupled device (CCD) camera 16, such as an infrared (IR) CCD camera 16.

Figure 10B:
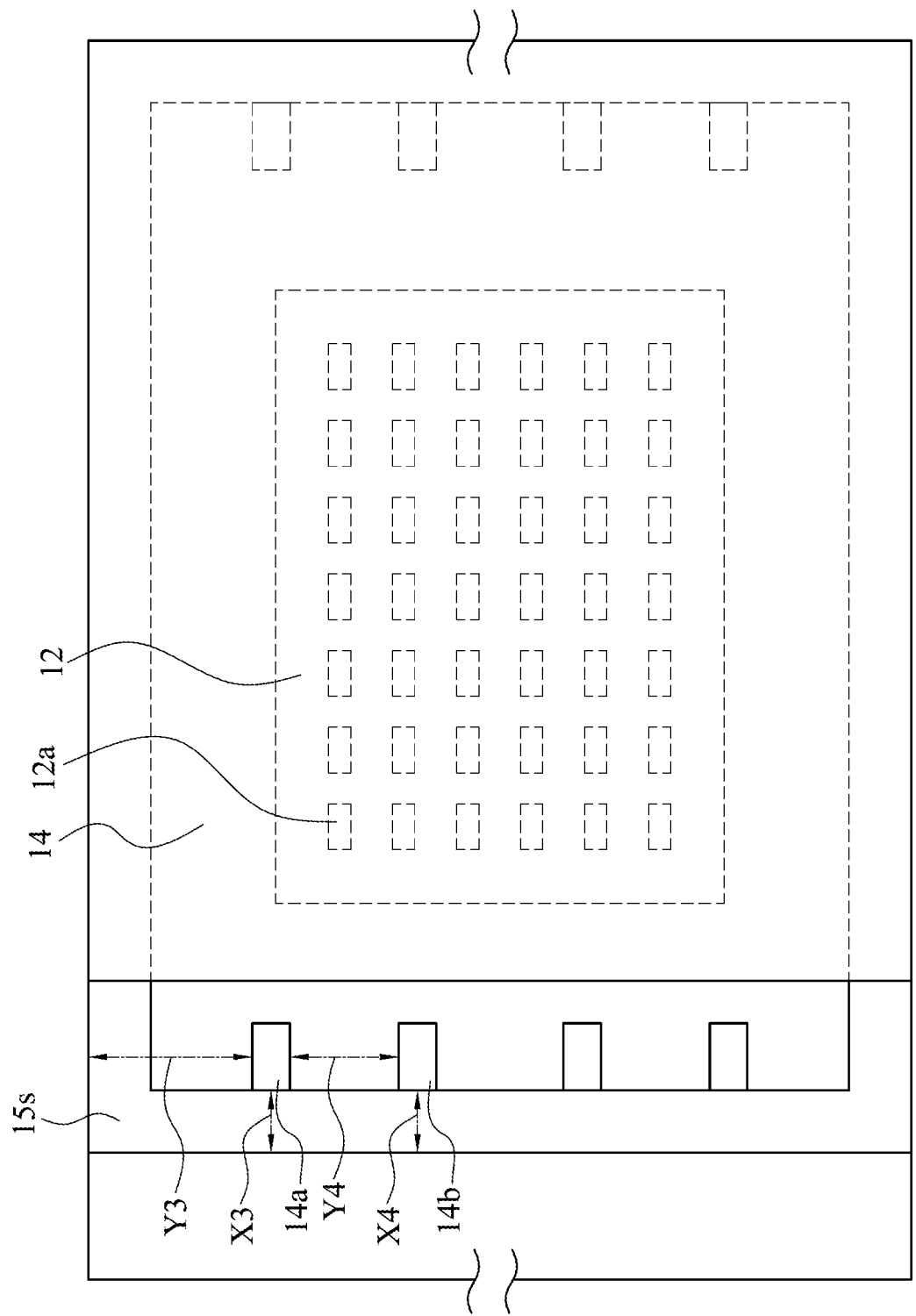
FIG. 10B illustrates a top view during one or more stages of a method of manufacturing a semiconductor package in accordance with some embodiments of the present disclosure.

In some embodiments, since silicon material is transparent to IR light, the IR CCD camera may locate the reference pattern 14a and the reference pattern 14b on the bonding device 14 by visualizing reference patterns 14a and 14b through of the substrate 15 (e.g., silicon substrate). In some embodiments, the IR CCD camera 16 images the reference patterns 14a and 14b on the bonding device 14 from the sites of scribe lines 15s to avoid the interference of the dense metal lines in the device region of the substrate 15 between adjacent scribe lines 15s. FIG. 10B shows an image captured by IR CCD camera 16, for example, the reference pattern 14a and the reference pattern 14b illustrated by solid lines can be detected by the IR CCD camera. Another part of the bonding device 14 and the electrical contact 12a illustrated by dotted lines cannot be detected by the IR CCD camera due to the interference of the dense metal lines in the device region of the substrate 15. As shown in FIG. 10B, a width of the scribe line 15s can be designed to be wider than the reference patterns 14a and 14b on the bonding device 14. In some embodiments, a portion of the reference patterns on the bonding device 14 are disposed at locations that can overlap with the scribe line 15s during the transferring and the alignment of the die 12 to the substrate 15, so that the IR CCD camera 16 can perform the on-site alignment based on the image information obtained in the operations illustrated in FIG. 8A to FIG. 8C.

A distance $X_3$ in the first direction between the reference pattern 14a and a boundary of the scribe line 15s may be determined. A distance $Y_3$ in the second direction between the reference pattern 14a and a boundary of the scribe line 15s may be determined. A distance $X_4$ in the first direction between the reference pattern 14b and a boundary of the scribe line 15s may be determined. A distance $Y_4$ in the second direction between the reference pattern 14b and a boundary of the scribe line 15s may be determined.

As described in the operations of FIGS. 8A-8C, the relative position between the electrical contact 12a the reference patterns (including the reference pattern 14a and the reference pattern 14b) may be determined. The relative position between the electrical contact 15a and the boundary of the scribe line 15s may be predetermined. Therefore, the electrical contact 12a and the electrical contact 15a may be aligned by adjusting the relative position between the reference patterns (including the reference pattern 14a and the reference pattern 14b) and the scribe line 15s.

After the image capturing operations illustrated in FIG. 8A to FIG. 8C, the image can be sent for die shift/die rotation computation concurrently with the flipping operation (e.g., shown in FIG. 9). Alternatively stated, under the die-to-substrate or die-to-wafer operation illustrated in present disclosure, the production throughput would not be compromised since the time consumed by alignment information computing is used to transfer and handle (e.g., flipping) the die 12 in a pipeline fashion.

Figure 11:
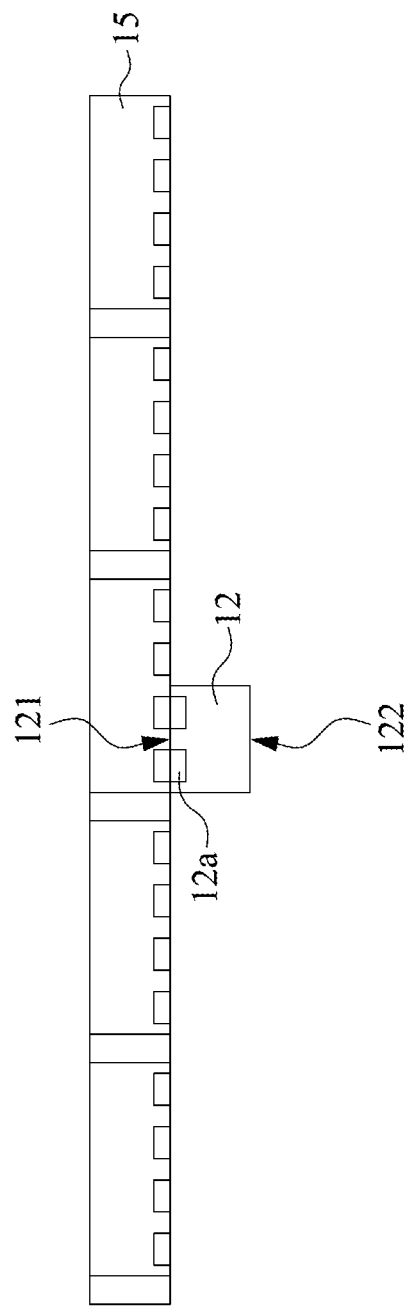
FIG. 11 illustrates a cross sectional view during one or more stages of a method of manufacturing a semiconductor package in accordance with some embodiments of the present disclosure.

Referring to FIG. 11, after the alignment is done, the die 12 is bonded to or mounted on the substrate 15. The electrical contact 12a and the electrical contact 15a are connected.

Spatially relative terms, such as "beneath," "below," "lower," "above," "upper," "left," "right" and the like, may be used herein for ease of description to describe one element or feature's relationship to another element(s) or feature(s) as illustrated in the figures. The spatially relative terms are intended to encompass different orientations of the device in use or operation, in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately", "substantially", "substantial" and "about" are used to describe and account for small variations. When used in conduction with an event or circumstance, the terms can refer to instances in which the event or circumstance occurs precisely as well as instances in which the event or circumstance occurs to a close approximation. As used herein with respect to a given value or range, the term "about" generally means within ±10%, ±5%, +1%, or +0.5% of the given value or range. Ranges can be expressed herein as from one endpoint to another endpoint or between two endpoints. All ranges disclosed herein are inclusive of the endpoints unless specified otherwise. The term "substantially coplanar" can refer to two surfaces within micrometers (m) of lying along the same plane, such as within 10 μm, within 5 m, within 1 μm, or within 0.5 μm of lying along the same plane. When referring to numerical values or characteristics as "substantially" the same, the term can refer to the values lying within ±10%, ±5%, ±1%, or ±0.5% of an average of the values.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. A method for manufacturing a semiconductor package, comprising:
   providing a die under a mounting surface of a carrier, wherein the die has a backside surface facing the mounting surface of the carrier, an active surface facing away from the mounting surface of the carrier, and an electrical contact exposed at the active surface;
   ejecting the die from the carrier to land on a temporary holder;
   moving a bonding device to a space between the backside surface of the die and the carrier;
   holding the die by the bonding device from the backside surface of the die;
   transferring the die and the bonding device to be under a bonding surface of a target substrate, wherein both of the mounting surface of the carrier and the bonding surface of the target substrate face downward, and wherein the active surface of the die remains facing downward while transferring the die to be under the bonding surface of the target substrate;
   flipping the die under the bonding surface of the target substrate; and
   bonding the active surface of the die to the bonding surface of the target substrate.

2. The method of claim 1,
   prior to providing the die under the mounting surface of the carrier, further comprising:
   disposing a substrate over the mounting surface of the carrier; and
   dicing the substrate into a plurality of dies.

3. The method of claim 2,
   after dicing the substrate into the plurality of die, further comprising:
   flipping the plurality of dies mounted on the carrier from facing upward to facing downward.

4. The method of claim 1, further comprising:
   prior to moving the bonding device to the space between the backside surface of the die and the carrier, moving the temporary holder down and away from the carrier.

5. The method of claim 1, after ejecting the die from the carrier to land on the temporary holder, the electrical contact on the active surface of the die is spaced apart from the temporary holder.

6. The method of claim 1, further comprising:
   capturing an image of a reference pattern of the bonding device and the electrical contact of the die to obtain a relative position information from a location under the bonding device and the die.

7. The method of claim 6, further comprising:
   aligning the die with the target substrate according to the relative position information.

8. The method of claim 7, further comprising:
   prior to bonding the active surface of the die to the bonding surface of the target substrate, adjusting a relative position between the reference pattern of the bonding device and a scribe line of the target substrate.

9. The method of claim 8,
   prior to adjusting the relative position between the reference pattern of the bonding device and the scribe line of the target substrate, further comprising capturing an image of the reference pattern of the bonding device from a location over the target substrate.

10. The method of claim 9, wherein capturing the reference pattern of the bonding device is done by an infrared (IR) camera.

11. The method of claim 10, wherein capturing the reference pattern of the bonding device by the IR camera is through a site of the scribe line of the target substrate.

12. A method for manufacturing a semiconductor package, comprising:
    providing a plurality of dies side-by-side on a same substantially planar surface of a carrier, wherein respective backside surfaces of the plurality of dies are substantially aligned in a direction parallel to the same substantially planar surface, and wherein respective active surfaces of the plurality of dies face away from the carrier;
    flipping the plurality of dies mounted on the carrier so that the respective active surfaces of the plurality of dies change from facing upward to facing downward; and
    transferring a die of the plurality of dies to be under a target substrate; and
    prior to transferring the die of the plurality of dies to be under the target substrate, ejecting the die from the carrier to land on a temporary holder; and
    after ejecting the die from the carrier to land on the temporary holder, moving the temporary holder down and away from the carrier; and
    after moving the temporary holder down and away from the carrier, moving a bonding device to a space between the backside surface of the die and the carrier.

13. The method of claim 12, after ejecting the die from the carrier to land on the temporary holder, an electrical contact on the active surface of the die is spaced apart from the temporary holder.

14. The method of claim 12, after moving the bonding device to the space between the backside surface of the die and the carrier, further comprising:
    holding the die by the bonding device from the backside surface of the die.

15. The method of claim 14, further comprising:
flipping the die under a bonding surface of the target substrate, wherein the active surface of the die remains facing downward until the die is flipped under the target substrate; and
aligning the die with the target substrate in reference to a relative position information.

16. The method of claim 15, wherein the relative position information comprises a relative position between reference patterns on the bonding device and a scribe line of the target substrate.

* * * * *